United States Patent
Shiozawa et al.

(10) Patent No.: US 9,138,835 B2
(45) Date of Patent: Sep. 22, 2015

(54) X-RAY PROCESSING DEVICE AND X-RAY PROCESSING METHOD

(71) Applicant: SEIKO Precision Inc., Narashino-shi, Chiba (JP)

(72) Inventors: Ikuo Shiozawa, Narashino (JP); Tsutomu Saito, Narashino (JP); Takeshi Tokairin, Narashino (JP); Koji Yoneda, Narashino (JP)

(73) Assignee: SEIKO PRECISION INC., Narashino-Shi, Chiba (JP)

(*) Notice: Subject to any disclaimer, the term of this patent is extended or adjusted under 35 U.S.C. 154(b) by 369 days.

(21) Appl. No.: 13/728,402

(22) Filed: Dec. 27, 2012

(65) Prior Publication Data

US 2013/0167346 A1    Jul. 4, 2013

(30) Foreign Application Priority Data

Dec. 28, 2011   (JP) .................................. 2011-290089

(51) Int. Cl.
*B23P 11/00* (2006.01)
*H05K 3/00* (2006.01)

(52) U.S. Cl.
CPC .............. *B23P 11/00* (2013.01); *H05K 3/0038* (2013.01); *H05K 3/0008* (2013.01); *H05K 3/0055* (2013.01); *H05K 2203/0346* (2013.01); *Y10T 29/51* (2015.01)

(58) Field of Classification Search
CPC .......... B23P 11/00; B41M 1/12; G01N 23/04; G03F 1/146; G03F 9/00; G03F 9/7076; G03F 9/7084; H04N 5/23293; H01L 2924/0002; H05K 1/0306; H05K 2203/166; H05K 3/0008; H05K 3/1216; H05K 3/0038; H05K 3/0055; H05K 2203/0346; Y01T 29/51
See application file for complete search history.

(56) References Cited

U.S. PATENT DOCUMENTS

| 4,825,917 A * | 5/1989 | Gonner ........................... 144/4.9 |
| 2005/0097727 A1* | 5/2005 | Iijima et al. ..................... 29/729 |

FOREIGN PATENT DOCUMENTS

| CN | 1151676 A | 6/1997 |
| CN | 1318973 A | 10/2001 |
| JP | 07-040204 A | 2/1995 |
| JP | 09-057695 A | 3/1997 |
| JP | 2005-172486 A | 6/2005 |

(Continued)

OTHER PUBLICATIONS

Human Translation of TW492269 (Wenshan Dong, Process of Shaping PC Board and Drilling Target), Feb. 2015, p. 1-11.*

(Continued)

*Primary Examiner* — Irakli Kiknadze
*Assistant Examiner* — Julio M Duarte-Carvajalino
(74) *Attorney, Agent, or Firm* — Howard & Howard Attorneys PLLC

(57) ABSTRACT

The X-ray processing device comprises a work table on which a processing object is placed, X-ray processors irradiating the processing object placed in a given processing zone on the work table with an X-ray for processing, a pressing member, and X-ray shielding sheets. The pressing member presses and collapses any remaining raised edges at the sides of the processing object. The X-ray shielding sheets are provided on the side of the pressing member that is closest to the processing zone and shield the X-ray from the X-ray processors.

10 Claims, 9 Drawing Sheets

(56) References Cited

FOREIGN PATENT DOCUMENTS

| JP | 2005172486 | * | 6/2005 | ............. G01N 23/04 |
| TW | 492269 | * | 6/2002 | ............... H05K 3/04 |

OTHER PUBLICATIONS

Machine Translation of JP2005172486 (Uno Masayaki, Radiographic inspection apparatus), Feb. 2015, p. 1-28.*
Chinese Office Action—Issued: Aug. 4, 2014.

* cited by examiner

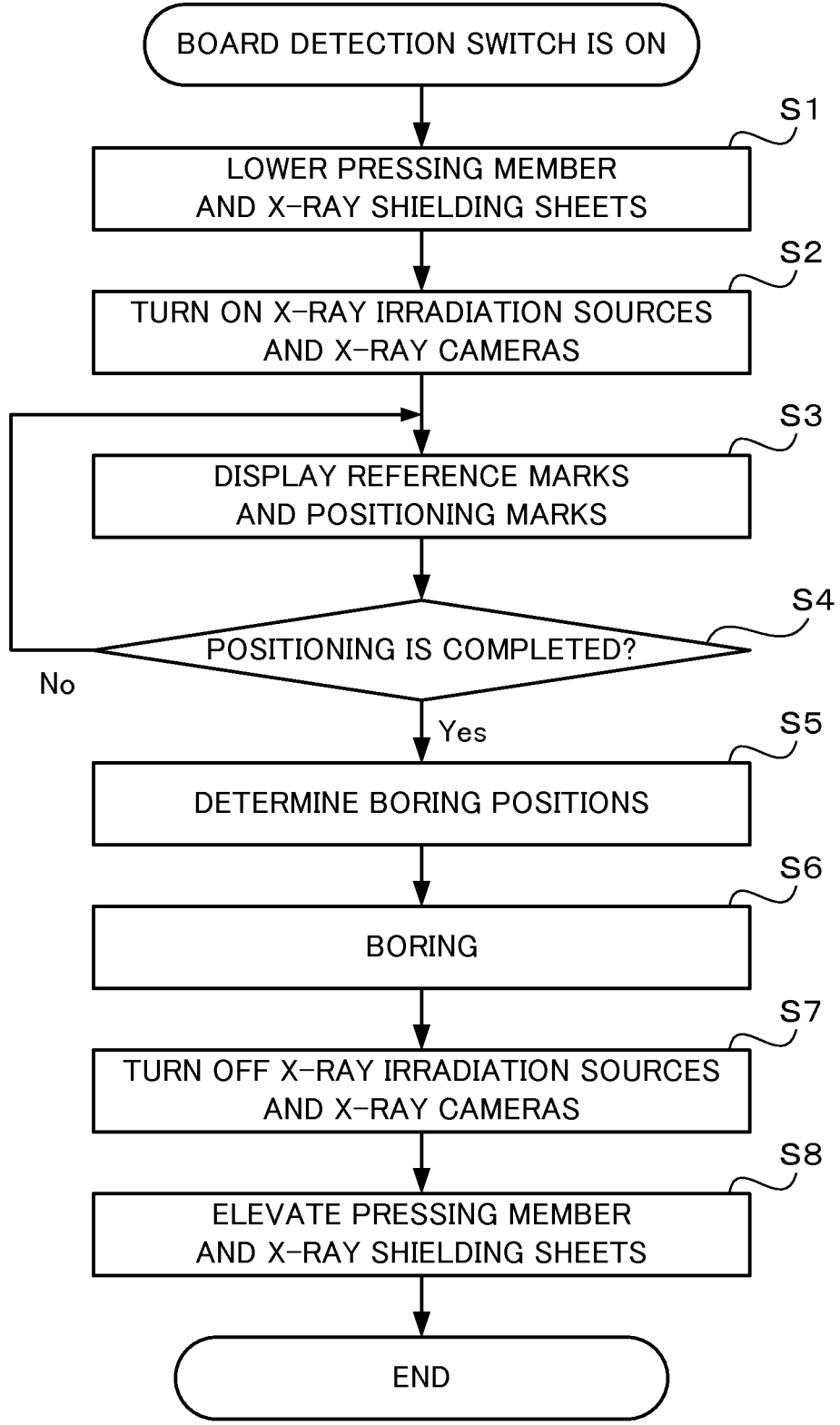

X-RAY PROCESSING DEVICE AND X-RAY PROCESSING METHOD

CROSS-REFERENCE TO RELATED APPLICATION

This application claims the benefit of Japanese Patent Application No. 2011-290089, filed on Dec. 28, 2011, the entire disclosure of which is incorporated by reference herein.

FIELD

This application relates to an X-ray processing device and X-ray processing method.

BACKGROUND

A circuit board is constructed by forming a circuit pattern including many circuit boards on one large substrate and cutting the substrate into multiple circuit boards. At least one pair of guide holes is opened in the substrate and fitted on guide pins provided on a cutting device to position and cut the substrate. Therefore, the guide holes serve as a reference for determining cutting positions and should be opened in precise positions.

A boring machine used for forming the guide holes captures an image of positioning marks formed on the substrate with an X-ray camera, processes the image, acquires boring positions, and moves a drill to the acquired positions for boring.

For example, Unexamined Japanese Patent Application Kokai Publication No. H9-57695 discloses a boring machine of the above type.

The above type of boring machines use an X-ray, which is harmful to humans. Therefore, the prior art boring machines comprise a shielding member covering the entire X-ray operation area and a lead-containing sheet cut into strips and provided at the entrance for the substrate so as to prevent the X-ray from leaking outside.

As shown in FIG. 8A, raised edges (burrs) 102 consisting of layers of copper foil and adhesive remain at the sides of a board 101 to be bored.

The raised edges 102 raise up the X-ray shielding skirt at the entrance and cause the X-ray to leak as the printed board 101 enters the boring machine.

The same incident may occur in various devices using an X-ray for processing such as X-ray processing devices using an X-ray for positioning in the course of stacking and heating/laminating single-layer printed boards.

SUMMARY

Then, the present invention provides an X-ray processing device with little X-ray leakage.

In order to achieve the above objective, the X-ray processing device of the present invention comprises:
  a work table on which a processing object is placed;
  X-ray processors irradiating the processing object placed in a given processing zone on the work table with an X-ray for processing;
  a presser provided above a conveying path leading the processing object to the processing zone and pressing and collapsing any remaining raised edges at the sides of the processing object; and
  shields provided on the side of the presser that is closest to the processing zone and shielding the X-ray from the X-ray processors.

The presser is made of a resin and has a curved surface at the part making contact with the raised edges, and a swing support in a way that the presser was allowed to swing freely is further provided.

The shields consist of sheets made of an X-ray shielding material. The sheets are composed of multiple sheet members layered with space in-between. The sheets are cut into strips at least in the lower end part.

A support supporting the presser and shields in a manner to enable crosswise movement as one piece with respect to the conveying path is further provided. Furthermore, a movement support supporting the presser and shields in a manner to enable movement as one piece up and down with respect to the conveying path is provided.

A controller lowering the presser and shields as one piece to near the processing object and making the X-ray processors emit an X-ray after the processing object is placed at a given position is further provided.

An X-ray shielding cover having an entrance for the processing object and covering the X-ray processors, presser, and shields and a shielding member in the form of a skirt provided at the entrance is further provided The X-ray processing method of the present invention comprises the following steps: conveying a processing object through an entrance into a processing zone where an X-ray is emitted; collapsing any remaining raised edges at the sides of the processing object; and shielding the X-ray at positions away from the entrance and where the raised edges of the conveyed processing object pass through.

BRIEF DESCRIPTION OF THE DRAWINGS

A more complete understanding of this application can be obtained when the following detailed description is considered in conjunction with the following drawings, in which:

FIG. 7 is a flowchart for explaining the operation of the controller;

DETAILED DESCRIPTION

Embodiment 1 of the present invention will be described hereafter with reference to the drawings.

Figure 1A:
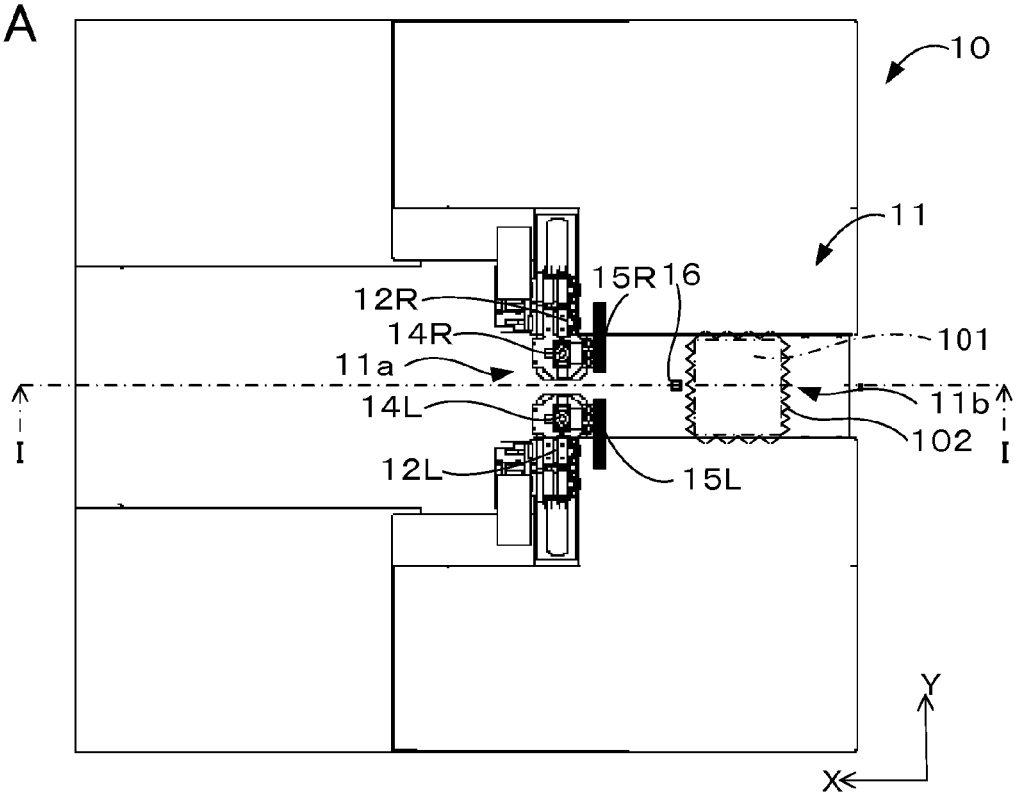
FIG. 1A is a plan view of a core part of the boring machine according to an embodiment of the present invention.
Figure 1B:
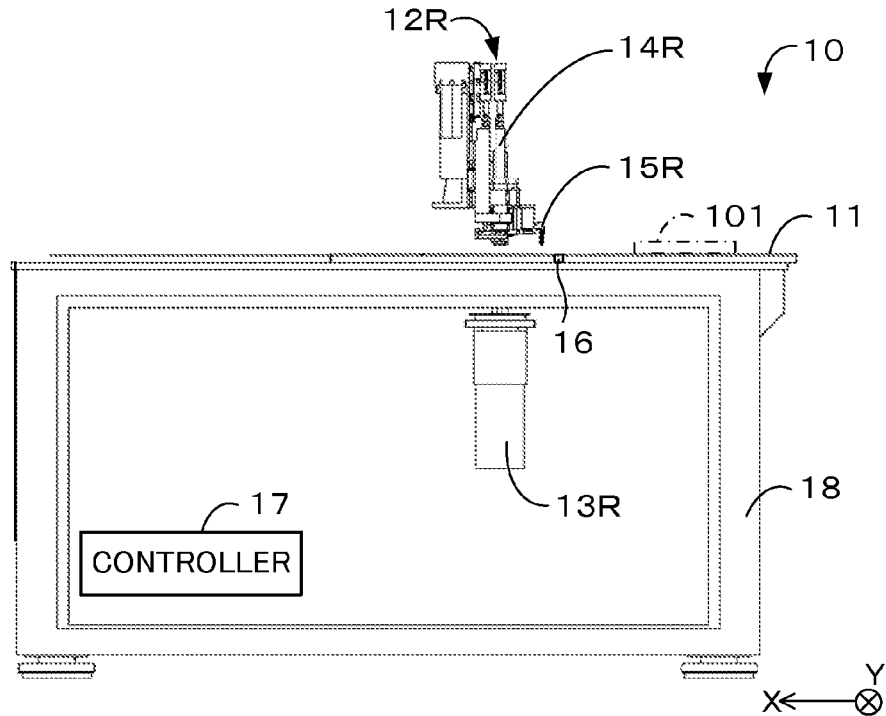
FIG. 1B is a cross-sectional view at the line I-I in FIG. 1A.

A boring machine 10 according to this embodiment comprises, as shown in a plane view of FIG. 1A and a cross-sectional view at the line I-I of FIG. 1B, a work table 11, a pair of X-ray irradiation sources 12R and 12L, a pair of X-ray cameras 13R and 13L, a pair of boring drills 14R and 14L, a pair of X-ray shielding devices 15R and 15L, a board detection sensor 16, and a controller 17.

The work table 11 is placed nearly horizontally on a platform 18. There is a processing zone 11a where a printed board 101 to be processed is placed, irradiated with an X-ray, and bored, and there is a conveying path 11b for conveying the printed board 101 to the processing zone 11a on the work table 11. The printed board 101 is conveyed and carried out in the X-axis direction in FIG. 1.

The X-ray irradiation sources 12R and 12L are each provided above the work table 11 and produce and emit an X-ray downward (toward the printed board 101 on the work table 11) according to the control of the controller 17.

The X-ray cameras 13R and 13L each receive the X-ray emitted from the corresponding X-ray irradiation sources 12R and 12L and transmitted through the printed board 101 to be processed and capture an image of positioning marks on the printed board 101 according to the control of the controller 17.

The pair of boring drills 14R and 14L moves the drill bits up and down by means of an air cylinder or the like, and rotates the drill bits by means of a motor or the like to make holes in the printed board 101 at given positions according to the control of the controller 17.

The X-ray irradiation source 12 R, X-ray camera 13R, and boring drill 14R are movable as one piece in the X-axis direction and in the Y-axis direction by means of an X-Y stage or the like. Similarly, the X-ray irradiation source 12 L, X-ray camera 13L, and boring drill 14L are movable as one piece in the X-axis direction and in the Y-axis direction by means of an X-Y stage or the like.

The X-ray shielding devices 15R and 15L are provided on either side of the conveying path 11b. The X-ray shielding devices 15R and 15L press and collapse the raised edges 102 at the sides of the printed board 101 conveyed on the conveying path 11b according to the control of the controller 17, and shield the X-ray from the X-ray irradiation sources 12R and 12L. The pair of X-ray shielding devices 15R and 15L will be described in detail later.

The board detection sensor 16 consists of an optical sensor, micro-switch, or the like. The board detection sensor 16 detects the printed board 101 to be processed being conveyed on the conveying path 11b and reaching within a given distance from the X-ray shielding devices 15R and 15L, and sends detection signals to the controller 17.

The controller 17 is composed of a CPU (central processing unit), a storage, and so on. The controller 17 operates according to control programs stored in the storage and controls the parts. Control details will be described later.

Figure 2:
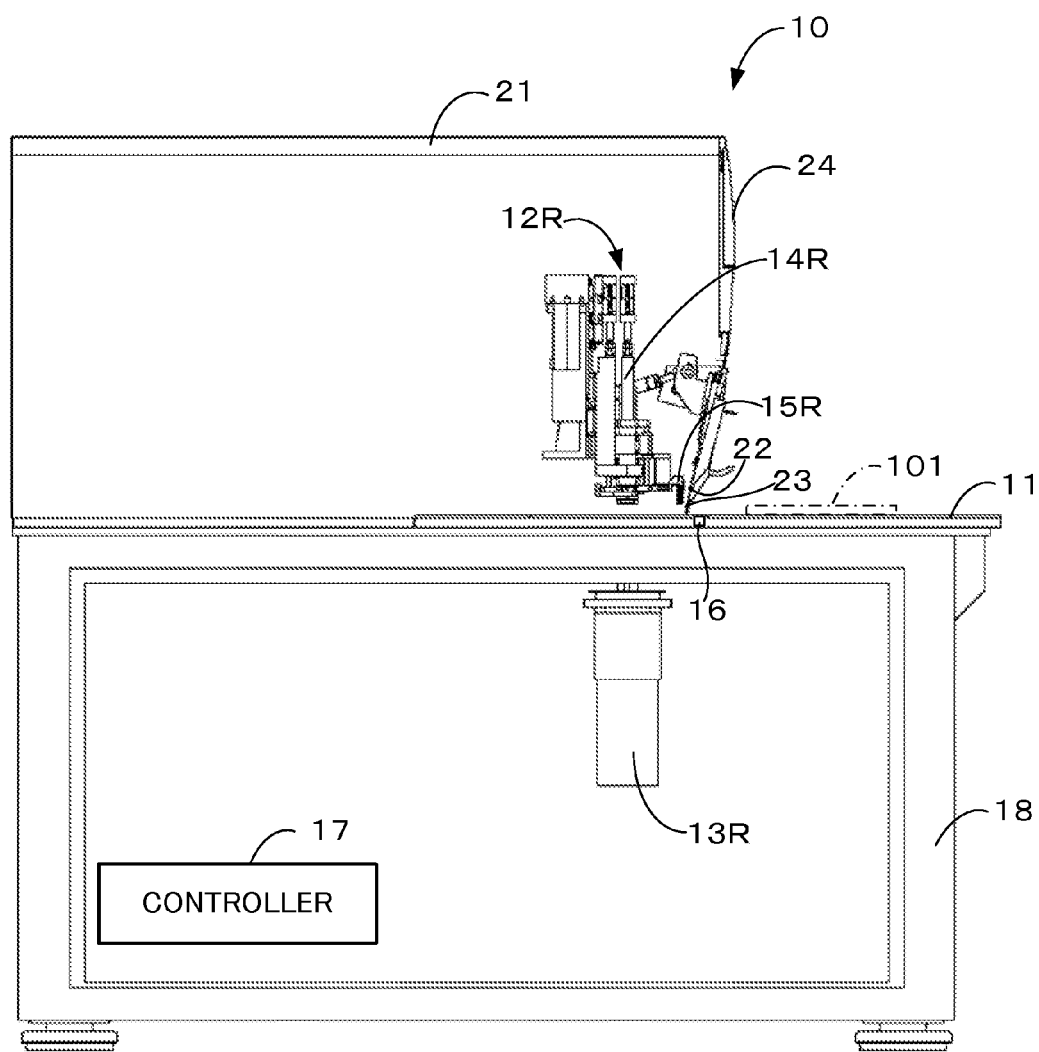
FIG. 2 is an illustration showing the structure including the shield (cover) in the cross-sectional view of FIG. 1B.
Figure 3:
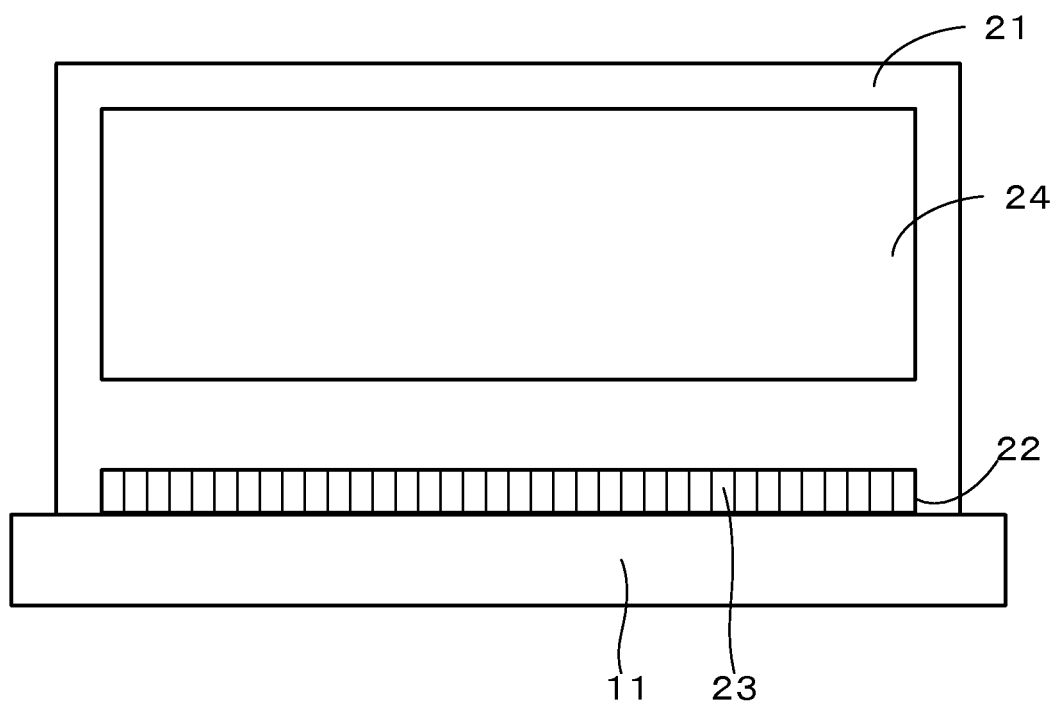
FIG. 3 is a front view of the shield of the boring machine shown in FIG. 2.

As shown in FIG. 2, the processing zone 11a where the above-described X-ray irradiation sources 12R and 12L, X-ray cameras 13R and 13L, boring drills 14R and 14L, X-ray shielding devices 15R and 15L are provided is covered with a shielding cover 21. The shielding cover 21 is made of a lead-containing metal or the like, and shields the X-ray from the X-ray irradiation sources 12R and 12L to prevent the X-ray from leaking outside. As shown in FIG. 3, the shielding cover 21 has, an entrance 22 through which the printed board 101 to be processed enters at the bottom of the front. An X-ray shielding skirt (curtain) 23 made of a lead-containing resin or the like is provided at the entrance 22. The X-ray shielding skirt 23 consists of strips.

Furthermore, a monitor 24 is provided in the upper part of the front of the shielding cover 21. The monitor 24 consists of a liquid crystal display, EL display, or the like, and displays various data according to the control of the controller 17.

Figure 4A:
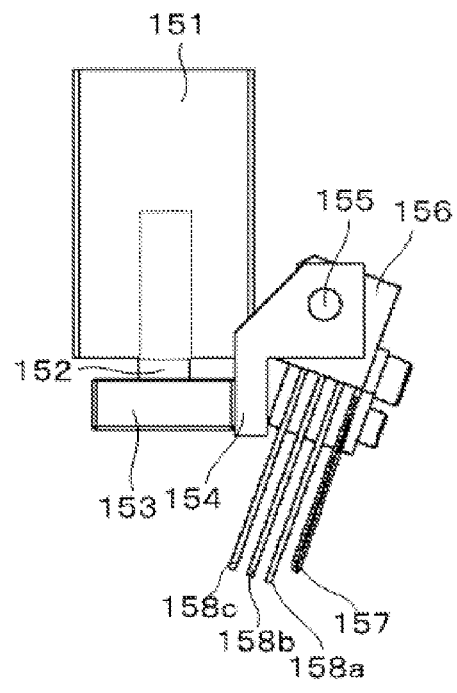
FIG. 4A is a side view showing the detailed structure of the X-ray shielding device shown in FIGS. 1A, 1B, and 2.
Figure 4B:
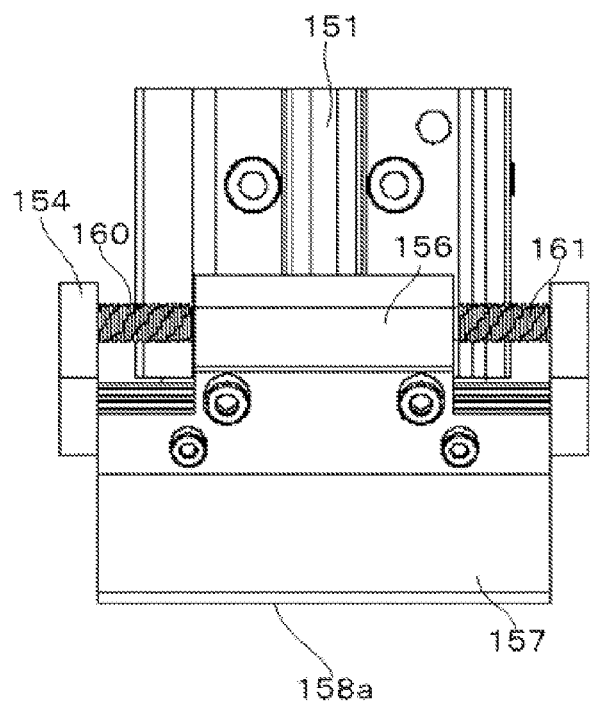
FIG. 4B is a front view showing the detailed structure of the X-ray shielding device shown in FIGS. 1A, 1B, and 2.
Figure 4C:
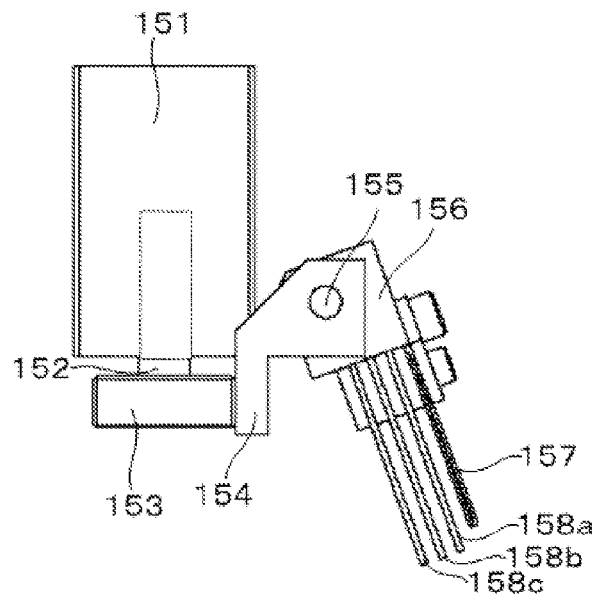
FIG. 4C is an illustration showing the detailed structure of the X-ray shielding device shown in FIGS. 1A, 1B, and 2 in which the presser and X-ray shielding sheets are rotated.

The X-ray shielding devices 15R and 15L will be described in detail hereafter with reference to FIGS. 4 and 5.

The X-ray shielding devices 15R and 15L have substantially the same structure. Therefore, the X-ray shielding device 15R will be described hereafter.

The X-ray shielding device 15R comprises a driver 151, a vertically movable shaft 152, a support 153, a support member 154, a support shaft 155, an anchoring member 156, a pressing member 157, three X-ray shielding sheets (screens) 158a to 158c, and springs 160 and 161.

The driver 151 is fixed at a side of the printed board 101, namely at a position where a raised edge 102 passes by, on the conveying path 11b. The driver 151 pushes down the vertically movable shaft 152 from its housed position or returns the vertically movable shaft 152 to its housed position according to the control of the controller 17.

Driven by the driver 151, the vertically movable shaft 152 moves up and down.

The support 153 is fixed to the lower end of the vertically movable shaft 152 and moves up and down as the vertically movable shaft 152 moves up and down.

The support member 154 is fixed to the side of the support 153 that is closer to the entrance 22, and supports the support shaft 155.

The support shaft 155 is fixed to the support member 154 at both ends in the support shaft direction (that is horizontal and perpendicular to the board conveying direction).

With the support shaft 155 being inserted in a through-hole formed in the support member 154, the anchoring member 156 is able to swing (rotate) about the support shaft 155 with given torque and slide in the Y-axis direction.

The springs 160 and 161 are provided between the anchoring member 156 and support member 154 and wound around the support shaft 155. The springs 160 and 161 bias the anchoring member 156 from either side so that the anchoring member 156 is positioned nearly at the center of the support shaft 155 under no load.

Figure 5:
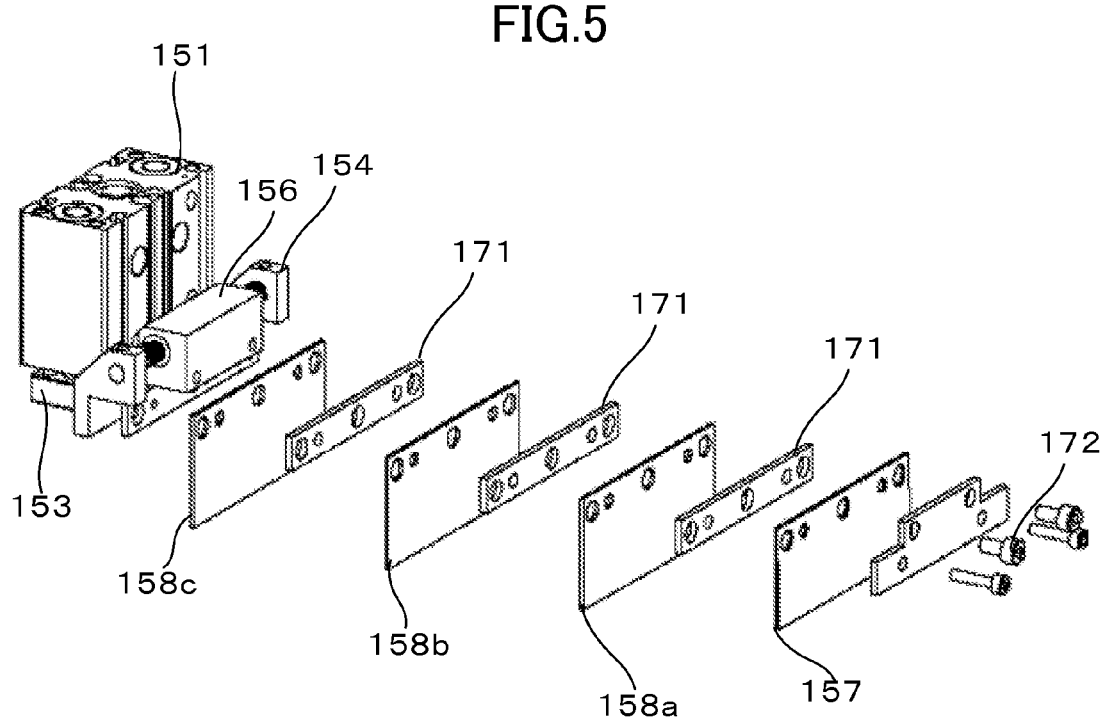
FIG. 5 is an exploded view of the X-ray shielding device shown in FIG. 4B.

As shown in an exploded view of FIG. 5, the pressing member 157 and X-ray shielding sheets 158a to 158c are layered at given intervals via spacers 171. They are anchored to the anchoring member 156 by fasteners 172 such as screws at the top.

Figure 8A:
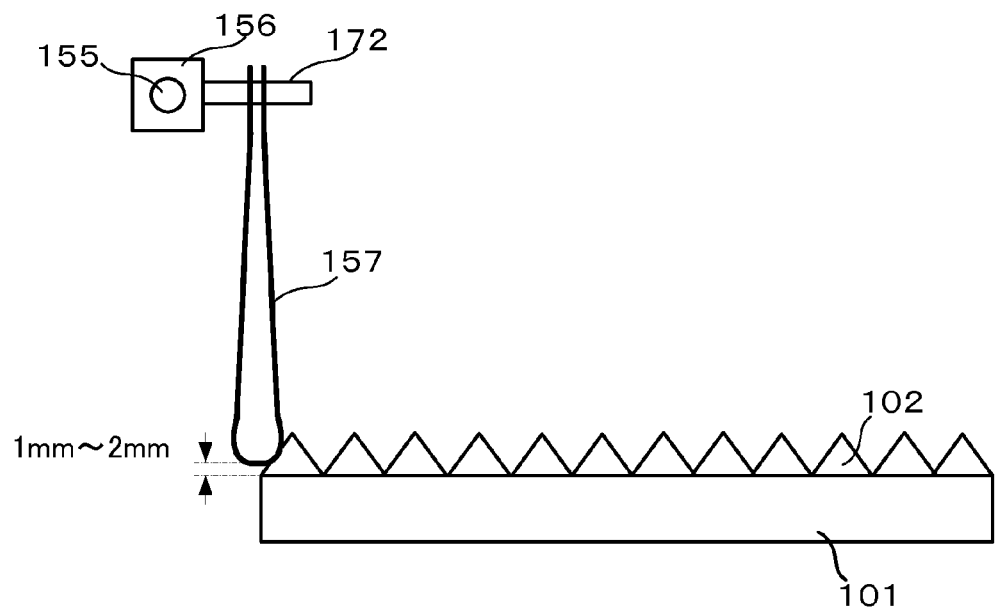
FIG. 8A is an enlarged view of the pressing member shown in FIG. 4.

As shown in FIG. 8A, the pressing member 157 is formed by folding a single resin sheet having a curved surface at the tip. The tip of the pressing member 157 is positioned 1 mm to 2 mm above the top surface of the printed board 101 when the X-ray shielding devices 15R and 15L are lowered.

Figure 6A:
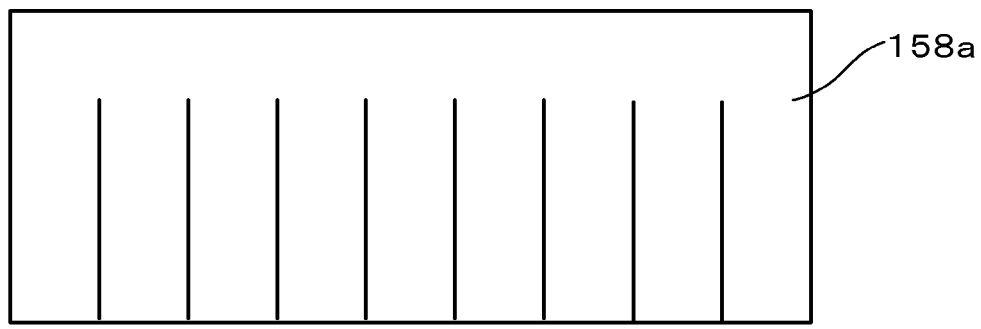
FIG. 6A is a front view of an X-ray shielding sheet shown in FIG. 4A.
Figure 6B:
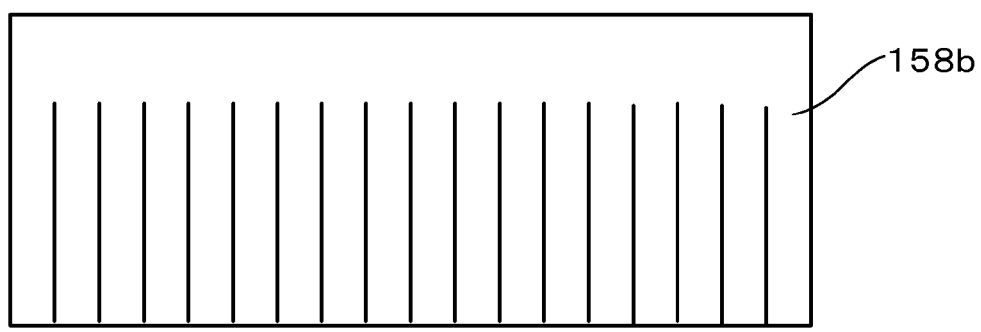
FIG. 6B is a front view of an X-ray shielding sheet shown in FIG. 4A.
Figure 6C:
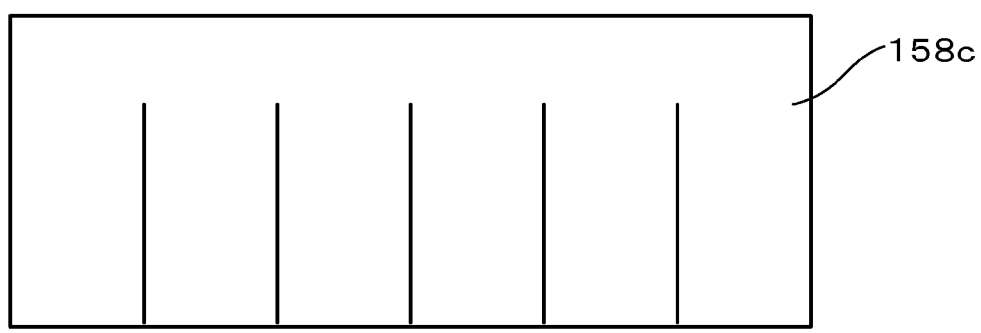
FIG. 6C is a front view of an X-ray shielding sheet shown in FIG. 4A.

The X-ray shielding sheets 158a to 158c each consist of a sheet (screen) capable of shielding the X-ray made from a material such as a lead-containing resin. As shown in FIGS. 6A, 6B, and 6C, the X-ray shielding sheets 158a to 158c have cuts in the lower end part excluding the upper end part, consisting of strips. The strip pitch varies depending on the sheet. Furthermore, the X-ray shielding sheets 158*a* to 158*c* are resilient enough to droop down by each sheet's own weight.

Operation of the boring machine 10 having the above structure will be described hereafter.

At the time of power-on, the driver 151 has the vertically movable shaft 152 elevated.

For boring the printed board 101, the operator places a printed board 101 on the work table 11 as shown in FIG. 1 and, for example, manually conveys the printed board 101 on the conveying path 11*b* toward the entrance 22 (in the X-axis direction).

As the printed board 101 reaches above the board detection sensor 16, the board detection sensor 16 sends a detection signal to the controller 17. Receiving the detection signal, the controller 17 starts the procedure shown in FIG. 7.

First, the controller 17 controls the driver 151 to lower the vertically movable shaft 152 (Step S1). As a result, the pressing member 157 has come down to 1 mm to 2 mm above the top surface of the printed board 101 as shown in FIG. 8A. The X-ray shielding sheets 158*a* to 158*c* droop down by their own weight and fill the gap between the printed board 101 and the shielding sheets.

Furthermore, the controller 17 turns on the X-ray irradiation sources 12R and 12L and X-ray cameras 13R and 13L (Step S2). As a result, the X-ray cameras 13R and 13L each start capturing a transmission image of the printed board 101.

Subsequently, as the operator inserts the printed board 101 into the entrance 22, the printed board 101 pushes the X-ray shielding skirt 23 away and advances into the processing zone 11*a* inside the shielding cover 21. Meanwhile, if the printed board 101 has any remaining raised edges 102, some openings may appear in the X-ray shielding skirt 23. However, the X-ray shielding sheets 158*a* to 158*c* are present between the X-ray irradiation sources 12R and 12L and X-ray shielding skirt 23, preventing the X-ray from leaking outside.

Figure 8B:
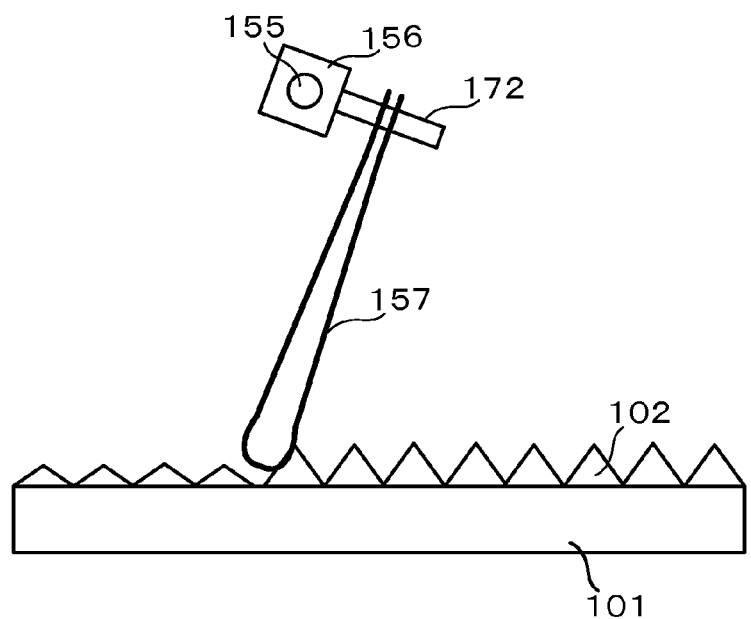
FIG. 8B is an illustration showing how the pressing member presses and collapses the raised edges of a printed board.

The X-ray shielding devices 15R and 15L are positioned on either side of the conveying path 11*b* as shown in FIG. 1A. As the leading end of the printed board 101 reaches the pressing member 157, the tip of the pressing member 157 makes contact with the raised edges 102 and causes torque, whereby the anchoring member 156 swings about the support shaft 155 as shown in FIG. 8B. As the printed board 101 is further inserted in this state, the raised edges 102 are pressed and collapsed by the pressing member 157 and become relatively flat as shown in FIG. 8B.

The printed board 101 having the flattened edges 102 passes under the X-ray shielding sheets 158*a* to 158*c*. Therefore, the X-ray shielding sheets 158*a* to 158*c* are barely raised and shield the X-ray in cooperation with the X-ray shielding skirt 23.

Figure 9:
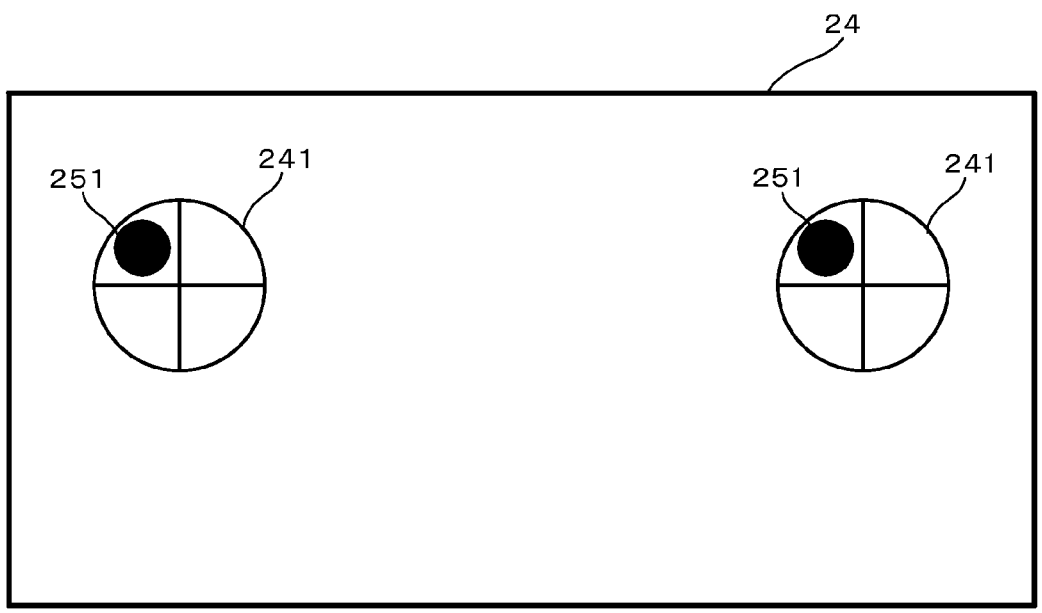
FIG. 9 is an illustration showing an exemplary display for explaining positioning.

Subsequently, the operator roughly positions the printed board 101. At this stage, the X-ray irradiation sources 12R and 12L have emitted an X-ray and the X-ray cameras 13R and 13L each acquire a transmission image of the printed board 101 according to the operation of the controller 17 as described above. The controller 17 displays the images acquired by the X-ray cameras 13R and 13L on the display 24 as shown in FIG. 9 by way of example (Step S3). Here, displays 241 are images of positioning reference marks and displays 251 are images of positioning marks on the printed board 101.

The operator moves the printed board 101 back and forth (in the X-axis direction) and/or crosswise (in the Y-axis direction) so that the positioning marks 251 coincide with the centers of the reference marks 241 while looking at the display on the display 24. Meanwhile, the anchoring member 156 slides along the support shaft 155 in the Y-axis direction and swings about the support shaft 155. Therefore, the X-ray shielding sheets 158*a* to 158*c* also move as the printed board 101 moves. Then, the X-ray shielding sheets 158*a* to 158*c* are prevented from being raised and causing significant leakage of the X-ray.

As the controller 17 detects the positioning marks 251 nearly coinciding with the centers of the reference marks 241 and coming to a stop (Step S4; Yes), the controller 17 presses and secures the printed board 101 against the work table 11 with a not-shown pressure member and determines the boring positions based on the positions of the detected positioning marks 251 (Step S5).

Subsequently, the controller 17 moves the boring drills 14R and 14L in the X-axis direction and in the Y-axis direction for positioning. After the positioning is completed, the controller 17 rotates and lowers the boring drills 14R and 14L to make holes in the printed board 101 at given positions (Step S6).

After the boring is completed, the controller 17 stops and elevates the boring drills 14R and 14L and release the pressure member. Furthermore, the controller 17 turns off the X-ray irradiation sources 12R and 12L and X-ray cameras 13R and 13L (Step S7).

Subsequently, the controller 17 controls the driver 151 to elevate the pressing member 157 and X-ray shielding sheets 158*a* to 158*c* (Step S8). Meanwhile, the anchoring member 156 returns to its home position (at the center of the support shaft 155) by elasticity of the springs 160 and 161.

Then, the operator can retrieve the easily bored printed board 101 from the processing zone 11*a*.

As described above, the boring machine according to this embodiment collapses any remaining raised edges 102 at the sides of the printed board 101 to be processed before the X-ray shielding sheets 158*a* to 158*c* shield the X-ray, whereby the X-ray shielding sheets 158*a* to 158*c* are prevented from being significantly raised and causing leakage of the X-ray.

The present invention is not confined to the above embodiment and various modifications and applications are available.

For example, the pressing member 157 can be of any material, shape, and size as long as the pressing member 157 can press and collapse the raised edges 102. For example, as for the material, resin, paper, and metals can be used. As for the shape, a folded sheet, single thick sheet, laminated sheet, or cylindrical form can be used. Furthermore, a roller can be used. However, it is desirable that the pressing member 157 has a curved surface at the part making contact with the printed board 101 and made of a soft material with respect to the constituent materials of the printed board 101 so as not to damage the printed board 101. Furthermore, any means causing torque for the pressing member 157 to press the raised edges 102 can be used, including the weights (own weights) of the anchoring member 156, pressing member 157, and X-ray shielding sheets 158*a* to 158*b*, and biasing by springs or rubber.

The number and shape of the X-ray shielding sheets 158*a* to 158*c* can be selected as appropriate.

In the above-described structure, the springs 160 and 161 biasing the anchoring member 156 can be replaced with any other elastic members. Furthermore, the anchoring member 156 can be at a fixed position in the Y-axis direction.

Furthermore, the X-ray shielding devices 15R and 15L can be provided outside the entrance 22 (shielding cover 21). In such a case, the X-ray shielding devices 15R and 15L are provided at positions where the raised edges 102 pass through.

The above-described structure is extensively applicable to devices using an X-ray for some sort of processing (imaging, irradiation of energy, analysis, and so on) other than boring machines.

The processing object of the present invention is not confined to the substrates and any object having raised edges can be processed.

The X-ray in this specification is not confined to the X-ray in the general sense (electromagnetic waves having a wavelength of approximately 1 pm to 10 nm) and includes electromagnetic waves/radioactive rays harmful to humans such as the gamma, α, and β rays.

Having described and illustrated the principles of this application by reference to one or more preferred embodiments, it should be apparent that the preferred embodiments, it should be apparent that the preferred embodiment may be modified in arrangement and detail without departing from the principles disclosed herein and that it is intended that the application be construed as including all such modifications and variations insofar as they come within the spirit and scope of the subject matter disclosed herein.

What is claimed is:

1. An X-ray processing device, comprising:
   a work table on which a processing object is placed;
   X-ray processors irradiating the processing object placed in a given processing zone on the work table with an X-ray for processing; a presser provided above a conveying path leading the processing object to the processing zone and pressing and collapsing any remaining raised edges at the sides of the processing object;
   shields provided on the side of the presser that is closest to the processing zone and shielding the X-ray from the X-ray processors; and
   a swing support supporting the presser in a way that the presser is allowed to swing freely.

2. The X-ray processing device according to claim 1, wherein:
   the presser is made of a resin and has a curved surface at the part making contact with the raised edges.

3. The X-ray processing device according to claim 1, wherein: the shields consist of sheets made of an X-ray shielding material.

4. The X-ray processing device according to claim 3, wherein: the sheets are composed of multiple sheet members layered with spaces in-between.

5. The X-ray processing device according to claim 3, wherein: the sheets are cut into strips at least in the lower end part.

6. The X-ray processing device according to claim 1, further comprising an X-ray shielding cover having an entrance for the processing object and covering the X-ray processors, presser, and shields, and a shielding member in the form of a skirt provided at the entrance.

7. An X-ray processing device, comprising:
   a work table on which a processing object is placed;
   X-ray processors irradiating the processing object placed in a given processing zone on the work table with an X-ray for processing; a presser provided above a conveying path leading the processing object to the processing zone and pressing and collapsing any remaining raised edges at the sides of the processing object;
   shields provided on the side of the presser that is closest to the processing zone and shielding the X-ray from the X-ray processors; and
   a support supporting the presser and shields in a manner to enable crosswise movement as one piece with respect to the conveying path.

8. An X-ray processing device, comprising:
   a work table on which a processing object is placed;
   X-ray processors irradiating the processing object placed in a given processing zone on the work table with an X-ray for processing; a presser provided above a conveying path leading the processing object to the processing zone and pressing and collapsing any remaining raised edges at the sides of the processing object;
   shields provided on the side of the presser that is closest to the processing zone and shielding the X-ray from the X-ray processors; and
   a movement support supporting the presser and shields in a manner to enable movement as one piece up and down with respect to the conveying path.

9. The X-ray processing device according to claim 8, further comprising a controller lowering the presser and shields as one piece to near the processing object and making the X-ray processors emit an X-ray after the processing object is placed at a given position.

10. An X-ray processing method comprising the following steps:
    conveying a processing object through an entrance into a processing zone where an X-ray is emitted;
    collapsing any remaining raised edges at the sides of the processing object using a presser that is supported by a swing support in a way that the presser is allowed to swing freely; and
    shielding the X-ray at positions away from the entrance and where the raised edges of the conveyed processing object pass through.

* * * * *